(12) United States Patent
Jang

(10) Patent No.: US 10,684,645 B2
(45) Date of Patent: Jun. 16, 2020

(54) ELECTRONIC DEVICE FOR REDUCING NOISE

(71) Applicant: Samsung Electronics Co., Ltd., Gyeonggi-do (KR)

(72) Inventor: Seokmin Jang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/254,685

(22) Filed: Jan. 23, 2019

(65) Prior Publication Data
US 2019/0235571 A1 Aug. 1, 2019

(30) Foreign Application Priority Data

Jan. 30, 2018 (KR) .................. 10-2018-0011124

(51) Int. Cl.
| | | |
|---|---|---|
| *H04B 1/38* | (2015.01) | |
| *G06F 1/16* | (2006.01) | |
| *H05K 5/00* | (2006.01) | |
| *H01Q 1/24* | (2006.01) | |
| *H05K 1/18* | (2006.01) | |
| *H04B 1/00* | (2006.01) | |
| *H04M 1/02* | (2006.01) | |
| *H05K 1/14* | (2006.01) | |
| *H05K 1/02* | (2006.01) | |
| *H04B 1/3827* | (2015.01) | |

(52) U.S. Cl.
CPC .......... *G06F 1/1626* (2013.01); *G06F 1/1698* (2013.01); *H01Q 1/243* (2013.01); *H04B 1/0053* (2013.01); *H04M 1/0277* (2013.01); *H05K 1/189* (2013.01); *H05K 5/0069* (2013.01); *H04B 1/3838* (2013.01); *H05K 1/0243* (2013.01); *H05K 1/147* (2013.01)

(58) Field of Classification Search
CPC ... G06F 1/1626; G06F 1/1698; H04B 1/0053; H04B 1/005; H04B 1/006; H04M 1/0277
See application file for complete search history.

(56) References Cited

U.S. PATENT DOCUMENTS 9,059,792 B2    6/2015 Park et al.
9,247,548 B2 *  1/2016 Swann ............. H04W 52/0254
(Continued)

FOREIGN PATENT DOCUMENTS

KR    10-2012-0113439 A    10/2012
KR    10-1429412 B1    8/2014
(Continued)

OTHER PUBLICATIONS

International Search Report dated May 1, 2019.

*Primary Examiner* — Tuan Pham
(74) *Attorney, Agent, or Firm* — Cha & Reiter, LLC.

(57) ABSTRACT

An electronic device includes an antenna, a display, a housing forming at least a portion of an exterior of the electronic device, a printed circuit board disposed within the housing, a connector disposed on the printed circuit board, a wire electrically connecting the connector and the display, a plurality of filters disposed on the printed circuit board, a switch selectively connecting the connector to one or more of the plurality of filters, and at least one processor electrically connected with the antenna, the display, and the switch.

19 Claims, 7 Drawing Sheets

(56) References Cited

U.S. PATENT DOCUMENTS

| | | | |
|---|---|---|---|
| 9,491,704 B2* | 11/2016 | Gosal | H04W 52/0232 |
| 9,991,971 B2 | 6/2018 | Mofidi | |
| 2006/0193302 A1* | 8/2006 | Morisawa | G06F 1/266 |
| | | | 370/338 |
| 2012/0257768 A1 | 10/2012 | Park et al. | |
| 2015/0072623 A1 | 3/2015 | Mofidi | |
| 2017/0227935 A1 | 8/2017 | Su et al. | |
| 2017/0331175 A1 | 11/2017 | Kwon et al. | |

FOREIGN PATENT DOCUMENTS

| | | |
|---|---|---|
| KR | 10-2016-0052615 A | 5/2016 |
| KR | 10-2016-0062738 A | 6/2016 |
| KR | 10-2017-0105855 A | 9/2017 |
| KR | 10-2017-0128015 A | 11/2017 |
| KR | 10-2018-0006653 A | 1/2018 |

* cited by examiner

ELECTRONIC DEVICE FOR REDUCING NOISE

CROSS-REFERENCE TO RELATED APPLICATION(S)

This application is based on and claims priority under 35 U.S.C. § 119 to Korean Patent Application No. 10-2018-0011124, filed on Jan. 30, 2018, in the Korean Intellectual Property Office, the disclosure of which is incorporated by reference herein its entirety.

BACKGROUND

1. Field

The present disclosure generally relates to technology for improving radiation efficiency of an antenna by reducing noise.

2. Description of Related Art

Electronic devices, which may communicate with an external device (e.g., base station, server, or a smartphone of another user), such as smartphones, wearable devices, or the like have become widely available. These electronic devices may be each equipped with an antenna for the purpose of communicating with the external device. For example, one electronic device may receive messages, photos, videos, and other data from the external device through the antenna.

A display may be equipped in the electronic device for the purposes of outputting various kinds of data received from the external device. The display may be supplied with power from a battery also equipped in the electronic device. However, noise (e.g., electromagnetic interference (EMI)) may occur when power is supplied from the battery. The noise may have an influence on signals that are transmitted/received by the antenna. To solve this issue, the electronic device may include a ferrite bead or a capacitor connected to a power terminal of the display. The bead or the capacitor may block or reduce noise, thus improving antenna efficiency.

The above information is presented as background information only to assist with an understanding of the present disclosure. No determination has been made, and no assertion is made, as to whether any of the above might be applicable as prior art with regard to the present disclosure.

SUMMARY

As mobile communication technologies develop, the number of frequency bands which an antenna may support is gradually increasing. As such, the bead or the capacitor may block only the noise in a specific frequency band, and thus may fail to block the noise in other bands also supported by the antenna. For example, the bead or the capacitor may block the noise in the GPS band when the GPS antenna transmits/receives a signal, but may fail to block the noise in the WiFi band when the Wi-Fi antenna transmits/receives a signal. As such, in the band where noise is not reduced, the electronic device may fail to communicate properly with the external device.

Aspects of the present disclosure are to address at least the above-mentioned problems and/or disadvantages and to provide at least the advantages described below. Accordingly, an aspect of the present disclosure is to provide an electronic device for solving the above-described problem and problems brought up in this specification.

In accordance with an aspect of the present disclosure, an electronic device may include an antenna, a display, a housing that forms at least a portion of an exterior of the electronic device, a printed circuit board that is disposed within the housing, a connector that is disposed on the printed circuit board, a wire that electrically connects the connector and the display, a plurality of filters that are disposed on the printed circuit board, a switch that selectively connects the connector to one or more of the plurality of filters, and at least one processor that is electrically connected with the antenna, the display, and the switch. The at least one processor may feed a power to the antenna, may transmit/receive a signal in a specified frequency band through the antenna supplied with the power, may determine whether the display is in an On state or an Off state, and may control the switch to connect the connector to one or more of the plurality of filters corresponding to the specified frequency band, when the display is in the On state.

In accordance with another aspect of the present disclosure, an electronic device may include a housing that forms an exterior of the electronic device and includes a conductive area and a non-conductive area, an antenna that includes at least a portion of the conductive area, a display that is disposed within the housing and includes a display panel and a display driver integrated circuit electrically connected with the display panel, a printed circuit board disposed within the housing, a connector that is disposed on the printed circuit board, a wire that is electrically connecting the connector and the display, a noise reducing circuit that is disposed on the printed circuit board, and at least one processor that is electrically connected with the antenna, the display, and the noise reducing circuit. The at least one processor may be to feed a power to the antenna, to transmit/receive a first signal in a specified frequency band through the antenna supplied with the power, to determine whether the display is in an On state or an Off state, based on a second signal received from the display driver integrated circuit, and to operate the noise reducing circuit based on the specified frequency band when the display is in the On state.

In accordance with another aspect of the present disclosure, an electronic device may include a display, a power supply module that supplies a power to the display and the electronic device, a communication module that communicates with an external device by using a first frequency band and/or a second frequency band, an adjustment circuit that is interposed between the display and the power supply module, and configured to operate in a first mode or a second mode, and a processor. The processor may be configured to detect an On state or an Off state of the display while communicating with the external device using the communication module. When the display is in the On state, the processor may be further configured to operate the adjustment circuit in the first mode when the communication module uses the first frequency band, and to operate the adjustment circuit in the second mode when the communication module uses the second frequency band.

According to embodiments of the present disclosure, radiation efficiency may be improved with regard to all relevant frequency bands.

In addition, various properties and advantages directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
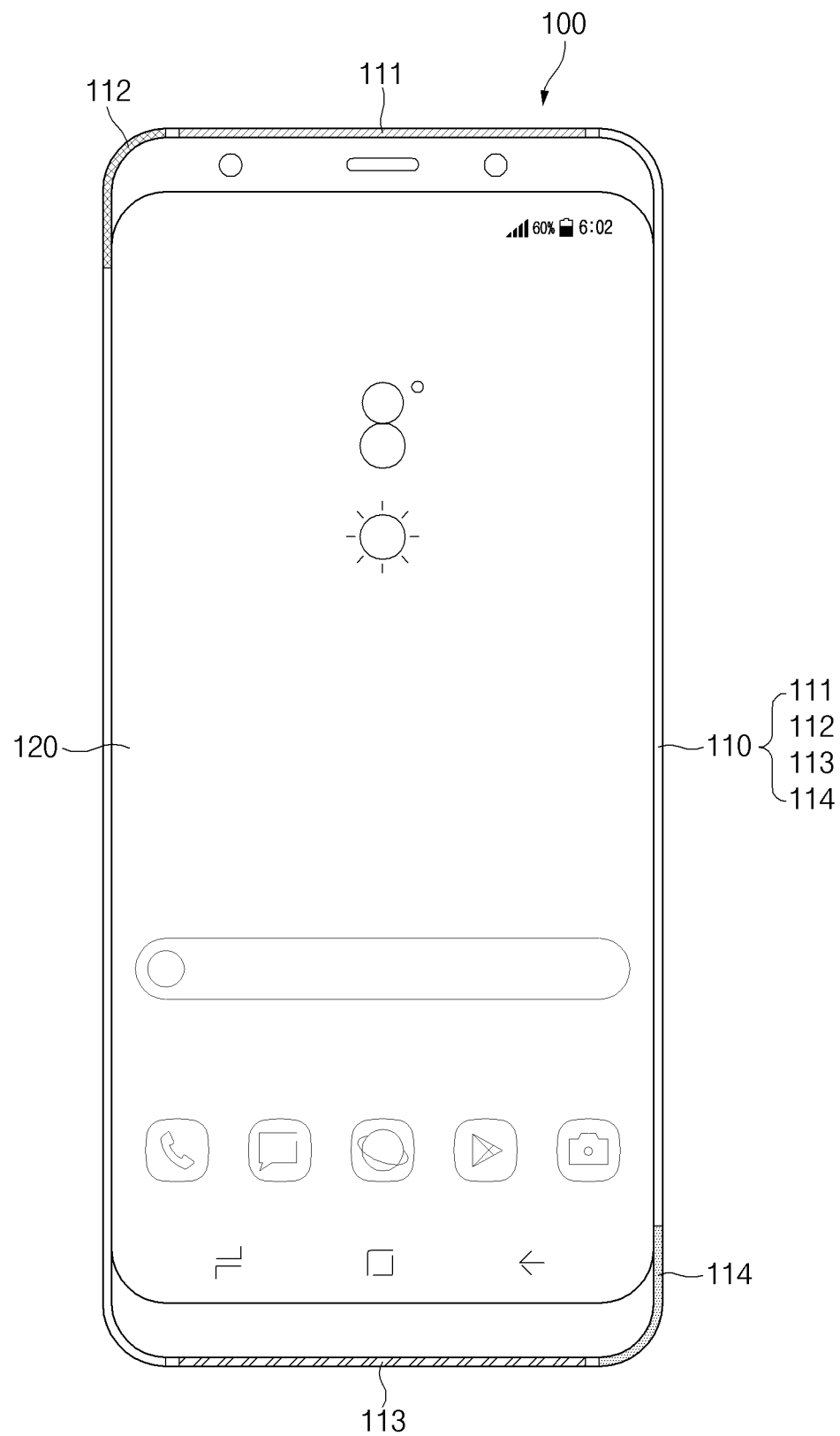
FIG. 1 is a front view of an electronic device according to an embodiment.

FIG. 1 is a front view of an electronic device according to an embodiment.

Referring to FIG. 1, an electronic device 100 may include a housing 110 and a display 120.

The housing 110 may protect various components included within the electronic device 100. For example, the display 120, a printed circuit board (e.g., 130 of FIG. 2), or the like may be accommodated within the housing 110, and the housing 110 may protect the components from external impact.

At least a portion of the housing 110 may be made of a conductive material (e.g., metal). The conductive portion of the housing 110 may be utilized as an antenna module (e.g., the antenna module 797 of FIG. 7) for transmitting/receiving signals in various specified frequency bands. The antenna module may include a plurality of antenna elements 111, 112, 113, and 114, and the electronic device 100 may transmit/receive signals of different frequency bands through each antenna element. In one embodiment, the conductive portion may be a side member interposed between a front cover of the housing 110 and a rear cover of the housing 110. The front cover of the housing 110 may include a cover glass that exposes the display 120. For example, the electronic device 100 may transceive signals in a band ranging from 700 MHz to 900 MHz through the first antenna element 111 and may transceive signals in a band ranging from 1.6 GHz to 2.7 GHz through the second antenna element 112. In addition, the electronic device 100 may transceive signals in the band ranging from 700 MHz to 900 MHz through the third antenna element 113 and may transceive signals in the band ranging from 1.6 GHz to 2.7 GHz through the fourth antenna element 114.

The display 120 may output content (e.g., text, image, video, icons, widgets, symbols, or the like) and/or may receive touch inputs (including touches, hovering inputs, or the like) from a user. The display 120 may be supplied with electrical energy from a battery (e.g., 150 of FIG. 2) disposed within the electronic device 100, and may operate using the electrical energy supplied from the battery 150.

According to an embodiment of the present disclosure, the electronic device 100 may reduce noise (e.g., electromagnetic interference (EMI)) that is generated when the battery 150 supplies power. The noise may have an influence on the first antenna element 111 to the fourth antenna element 114, but the electronic device 100 may reduce the noise. As such, the radiation efficiency of the first antenna element 111 to the fourth antenna element 114 may be improved.

TABLE 1

| Frequency band | Band 1 BER | Band 2 BER | Band 3 CNO |
|---|---|---|---|
| Display Off | 105.77 | 96.15 | 43 |
| Display On | 105.34 | 94.92 | 42.1 |
| Decrement | −0.43 | −1.23 | −0.9 |

Referring to Table 1, an Off state of the display 120 may mean a state where the display 120 is not operating because electrical energy is not supplied from the battery 150 to the display 120. An On state of the display 120 may mean a state where the display 120 is operating as electrical energy is supplied from the battery 150 to the display 120.

A bit error ratio BER may mean a ratio of errors which occur when the first antenna element 111 to the fourth antenna element 114 transmit/receive signals. A carrier to noise density CNO may mean a value obtained by subtracting the noise from the signal(s) which the first antenna element 111 to the fourth antenna element 114 transmit/receive.

Conventionally, noise may occur when the display switches from the Off state to the On state. The noise may have an influence on at least any one of a first antenna element to a fourth antenna element. As such, radiation efficiency may be reduced in specific frequency bands used by the antenna.

However, the electronic device 100 according to an embodiment of the present disclosure may reduce or block the noise in the On state of the display 120. As such, the BER and the CNO may be improved in the specified frequency bands. That is, even though the display 120 is turned on, with regard to all specified frequency bands, the BER and the CNO may be almost similar to those in the Off state of the display 120. For example, the BER during On state maybe within 10$ of the BER during Off state.

In this disclosure, the description given with reference to FIG. 1 may be identically applied to components in FIGS. 2-7 which have the same reference numerals as those of the electronic device 100 illustrated in FIG. 1.

Figure 2:
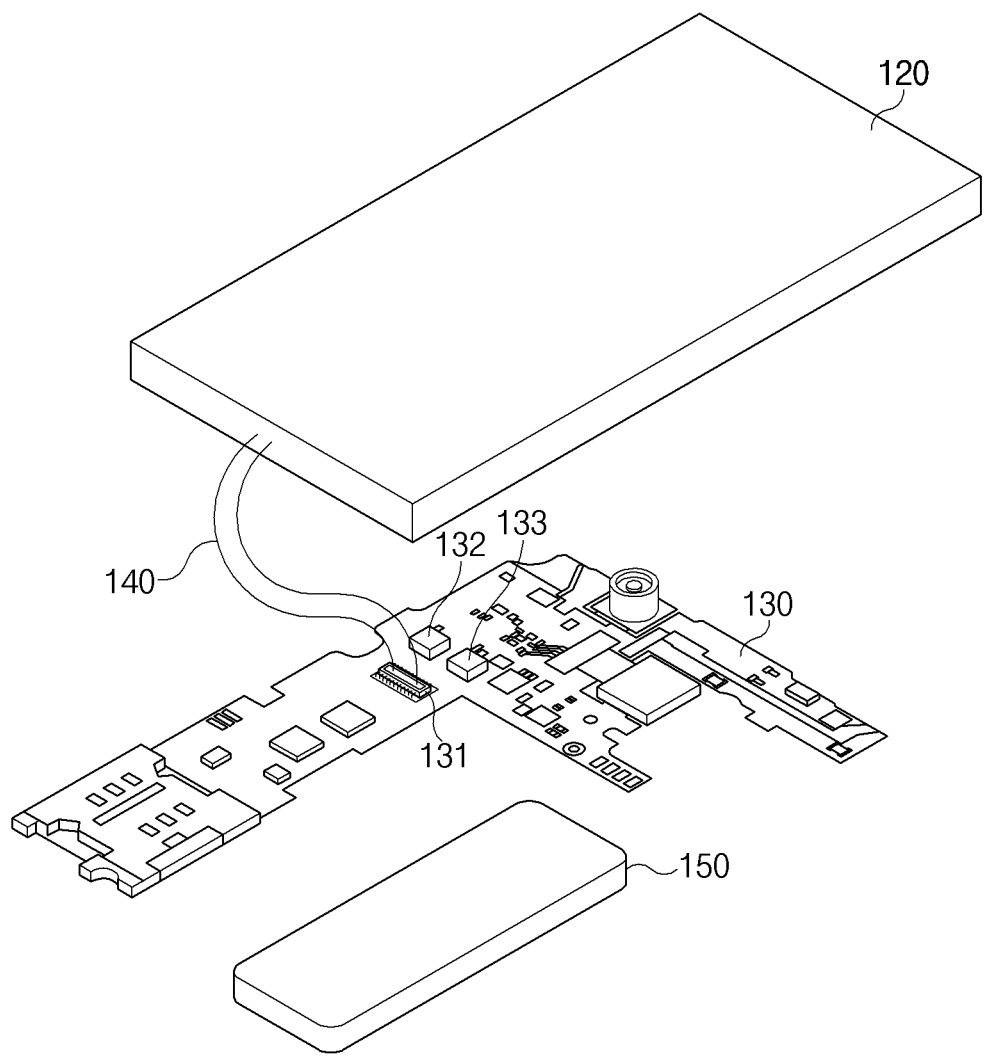
FIG. 2 illustrates a display, a printed circuit board, and a battery according to an embodiment.

FIG. 2 illustrates a display, a printed circuit board, and a battery according to an embodiment. FIG. 2 is a perspective view of the display 120, the printed circuit board 130, and the battery 150 disposed within the electronic device 100.

Referring to FIG. 2, the electronic device 100 may include the display 120, the printed circuit board 130, and the battery 150.

Various electronic parts, elements, printed circuits, or the like of the electronic device 100 may be mounted on the printed circuit board 130. For example, an application processor, a communication processor, a memory, a connector 131, a noise reducing circuit 132, or the like may be mounted on the printed circuit board 130. In this disclosure, the printed circuit board 130 may be referred to as a "main board" or a "printed board assembly (PBA)."

The battery 150 may bidirectionally convert chemical energy and electrical energy. For example, the battery 150 may convert chemical energy into electrical energy and may supply the converted electrical energy to the display 120 and various components or modules mounted on the printed circuit board 130. Alternatively, the battery 150 may convert and store electrical energy supplied from an external device (e.g. a charger) into chemical energy. According to an embodiment, a power management module for managing the charging and discharging of the battery 150 may be included in the printed circuit board 130. In this disclosure, the "power management module" may be referred to as a "power supply module."

According to an embodiment, the printed circuit board 130 and the display 120 may be electrically connected through a wire 140, which may be a flexible printed circuit board (FPCB). For example, the connector 131 may be positioned on the printed circuit board 130, and the wire 140 may electrically connect the printed circuit board 130 and the display 120 by connecting the connector 131 and the display 120. According to an embodiment, another connector (hereinafter referred to as an "additional connector") may be positioned at one end of the display 120. In this case, the wire 140 may electrically connect the printed circuit board 130 and the display 120 by connecting the connector 131 and the additional connector.

According to an embodiment, the connector 131 and the battery 150 may be electrically connected. Since the connector 131 and the battery 150 are electrically connected, electrical energy may be supplied to the display 120 through the connector 131 and the wire 140.

At least one processor 133 may include an application processor and a communication processor. The at least one processor 133 may be electrically connected with the connector 131 and the noise reducing circuit 132 on the printed circuit board 130. The processor 133 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the at least one processor 133 may feed (or supply) power to the first antenna element 111 to the fourth antenna element 114 and may transmit/receive signals in the specified frequency bands of the first antenna element 111 to the fourth antenna element 114. In this disclosure, "feeding" may mean an operation in which the at least one processor 133 applies a current to the first antenna element 111 to the fourth antenna element 114.

According to an embodiment, the at least one processor 133 may detect the On/Off state of the display 120. When the result of the detection indicates that the display 120 is in the On state, the at least one processor 133 may control the noise reducing circuit 132 such that noise is input from the connector 131 to the noise reducing circuit 132.

The noise reducing circuit 132 may reduce the input noise, thus preventing radiation efficiency of the first antenna element 111 to the fourth antenna element from being reduced. As such, the electronic device 100 may continue to transmit/receive signals in the specified frequency bands when the display 120 is in the On state.

Figure 3:
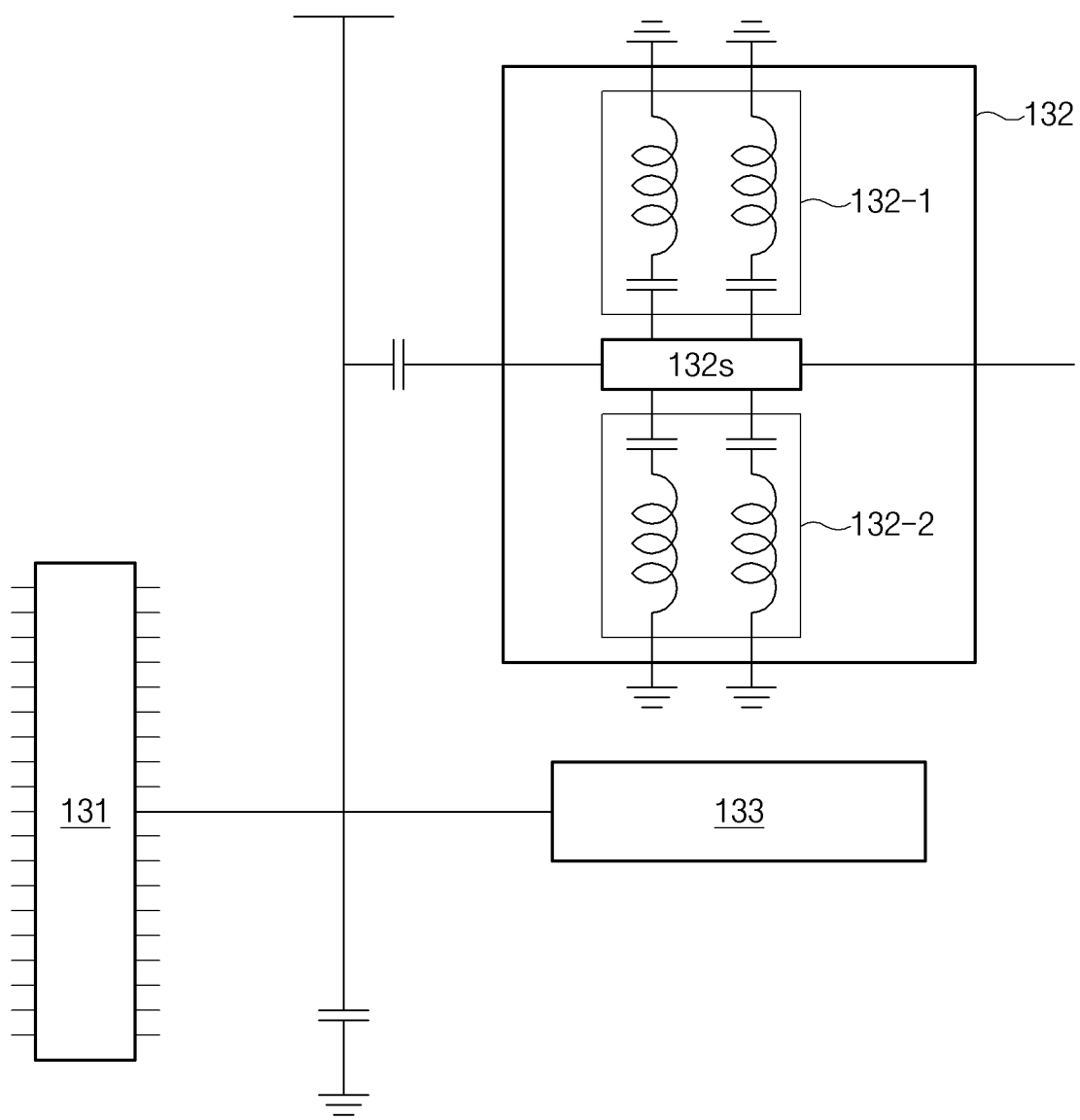
FIG. 3 illustrates a detailed circuit diagram of a connector, a noise reducing circuit, and at least one processor according to an embodiment.

FIG. 3 illustrates a detailed circuit diagram of a connector, a noise reducing circuit, and at least one processor according to an embodiment. FIG. 3 is a circuit diagram for describing how the electronic device 100 reduces noise.

Referring to FIG. 3, the noise reducing circuit 132 may include a plurality of filters 132-1 and 132-2 and a switch 132s. The noise reducing circuit 132 illustrated in FIG. 3 is exemplary, and embodiments of the present disclosure are not limited in scope and spirit to the noise reducing circuit 132 illustrated in FIG. 3. For example, the noise reducing circuit 132 may include three or more filters, and the switch 132s may connect the three or more filters and the connector 131.

The plurality of filters 132-1 and 132-2 may include the first filter 132-1 and the second filter 132-2. The first filter 132-1 and the second filter 132-2 may reduce noise. The first filter 132-1 and the second filter 132-2 may be composed of a plurality of capacitive elements (e.g., capacitors) and a plurality of inductive elements (e.g., inductors). In this disclosure, each of the first filter 132-1 and the second filter 132-2 may be referred to as a "notch filter" or a "band stop filter."

The switch 132s may selectively connect the first filter 132-1 or the second filter 132-2 with the connector 131. For example, one end of the switch 132s may be connected with the connector 131, and the other end of the switch 132s may be selectively connected with the first filter 132-1 or the second filter 132-2. Thus, when the switch 132s connects the first filter 132-1 with the connector 131, the second filter 132-2 and the connector 131 may be disconnected. On the other hand, when the switch 132s connects the second filter 132-2 with the connector 131, the first filter 132-1 and the connector 131 may be disconnected.

According to an embodiment, the at least one processor 133 may feed power to the first antenna element 111 to the fourth antenna element 114 to transmit/receive signal in various specified frequency bands. To do this, the at least one processor 133 may detect the frequency band of the signal that is transmitted/received through the antenna element supplied with the power.

Also, the at least one processor 133 may detect the On/Off state of the display 120. For example, the at least one processor 133 may detect the On/Off state of the display 120 based on a signal received from a display driver integrated circuit (DDI) (not illustrated). When the result of the detection indicates that the display 120 is in the On state, the at least one processor 133 may allow the switch 132s to be connected with the first filter 132-1 or the second filter 132-2 based on the frequency band of the signal to be transceived.

For example, in the case where the electronic device 100 is receiving a signal through the first antenna element 111, the at least one processor 133 may allow the switch 132s to be connected with the first filter 132-1. As such, noise may be reduced through the connector 131, the switch 132s, and the first filter 132-1, and the electronic device 100 may prevent the noise from having an influence on the first antenna element 111.

For another example, in the case where the electronic device 100 transmits/receive a signal through the third antenna element 113, the at least one processor 133 may allow the switch 132s to be connected with the second filter 132-2. As such, the noise may be reduced through the connector 131, the switch 132s, and the second filter 132-2, and the electronic device 100 may prevent the noise from having an influence on the third antenna element 113.

The above embodiments are exemplary, and the connection relationships between the switch 132s and the filters 132-1 and 132-2 may be different from the above embodiments. For example, in the case where the electronic device 100 is receiving a signal through the second antenna element 112, the at least one processor 133 may allow the switch 132s to be connected with the first filter 132-1.

The electronic device 100 according to an embodiment of the present disclosure may reduce noise by dynamically changing filters connected with the connector 131 depending on the current frequency band. Since noise is dynamically reduced in the frequency band of each antenna element, all of the first antenna element 111 to the fourth antenna element 114 may transmit/receive signals without noise influence. In other words, according to an embodiment of the present disclosure, radiation efficiency may be improved in all relevant frequency bands.

Figure 4:
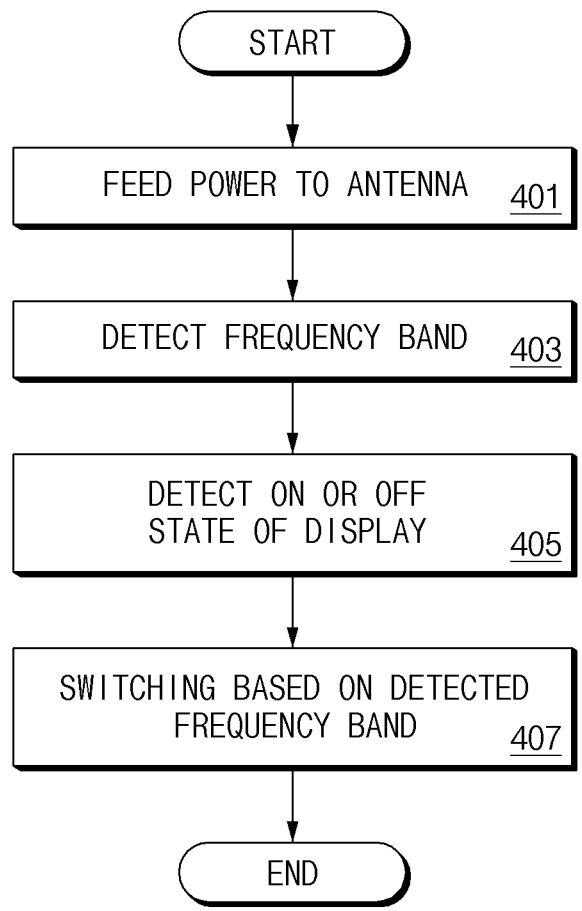
FIG. 4 illustrates an operation flowchart according to an embodiment.

FIG. 4 illustrates an operation flowchart according to an embodiment.

Referring to FIG. 4, in operation 401, the electronic device 100 (e.g., the processor 133) may transmit/receive a signal through an antenna (or an antenna module). For example, the electronic device 100 may transmit/receive a signal through at least any one of the first antenna element 111 to the fourth antenna element 114. In an embodiment, to do so, the electronic device 100 may supply power to the first antenna element 111, or may supply the power to the third antenna element 113 and the fourth antenna element 114. In another embodiment, the electronic device 100 may transmit/receive signals through all of the first antenna element 111 to the fourth antenna element 114.

In operation 403, the electronic device 100 (e.g., the processor 133) may detect the frequency band of the signal which is being transmitted or received. For example, in the case where the electronic device 100 receives a signal through the first antenna element 111, the electronic device 100 may determine that the frequency band ranges from 700 MHz to 900 MHz. In another embodiment, in the case where the electronic device 100 transmits/receives signals through the third antenna element 113 and the fourth antenna element 114, the electronic device 100 may determine that frequency bands range from 700 MHz to 900 MHz and from 1.6 GHz to 2.7 GHz, respectively.

In operation 405, the electronic device 100 (e.g., the processor 133) may detect the On or Off state of the display 120. For example, the at least one processor 133 may detect the On or Off state of the display 120 based on a signal received from the display driver integrated circuit. When the result of the detection indicates that the display 120 is in the Off state, the electronic device 100 may not perform the switching operations described above in connection with FIG. 3. In other words, when the display 120 is in the Off state, the electronic device 100 may control the switch 132s such that the switch 132s is not connected with both the first filter 132-1 and the second filter 132-2. In contrast, when the display 120 is in the On state, the electronic device 100 may perform operation 407.

In operation 407, the electronic device 100 (e.g., the processor 133) may perform a switching operation based on the detected frequency band. For example, when the electronic device 100 is receiving a signal in the frequency band ranging from 700 MHz to 900 MHz, the electronic device 100 may control the switch 132s such that the switch 132s is connected with the first filter 132-1. In another embodiment, when the electronic device 100 is transmitting/receiving a signal in the frequency band ranging from 1.6 GHz to 2.7 GHz, the electronic device 100 may control the switch 132s such that the switch 132s is connected with the second filter 132-2.

When the connector 131 is connected with the first filter 132-1 or the second filter 132-2, the first filter 132-1 or the second filter 132-2 may reduce noise in the corresponding band. Since noise is reduced, the first antenna element 111 to the fourth antenna element 114 may transmit/receive signals without influence from the noise.

Figure 5:
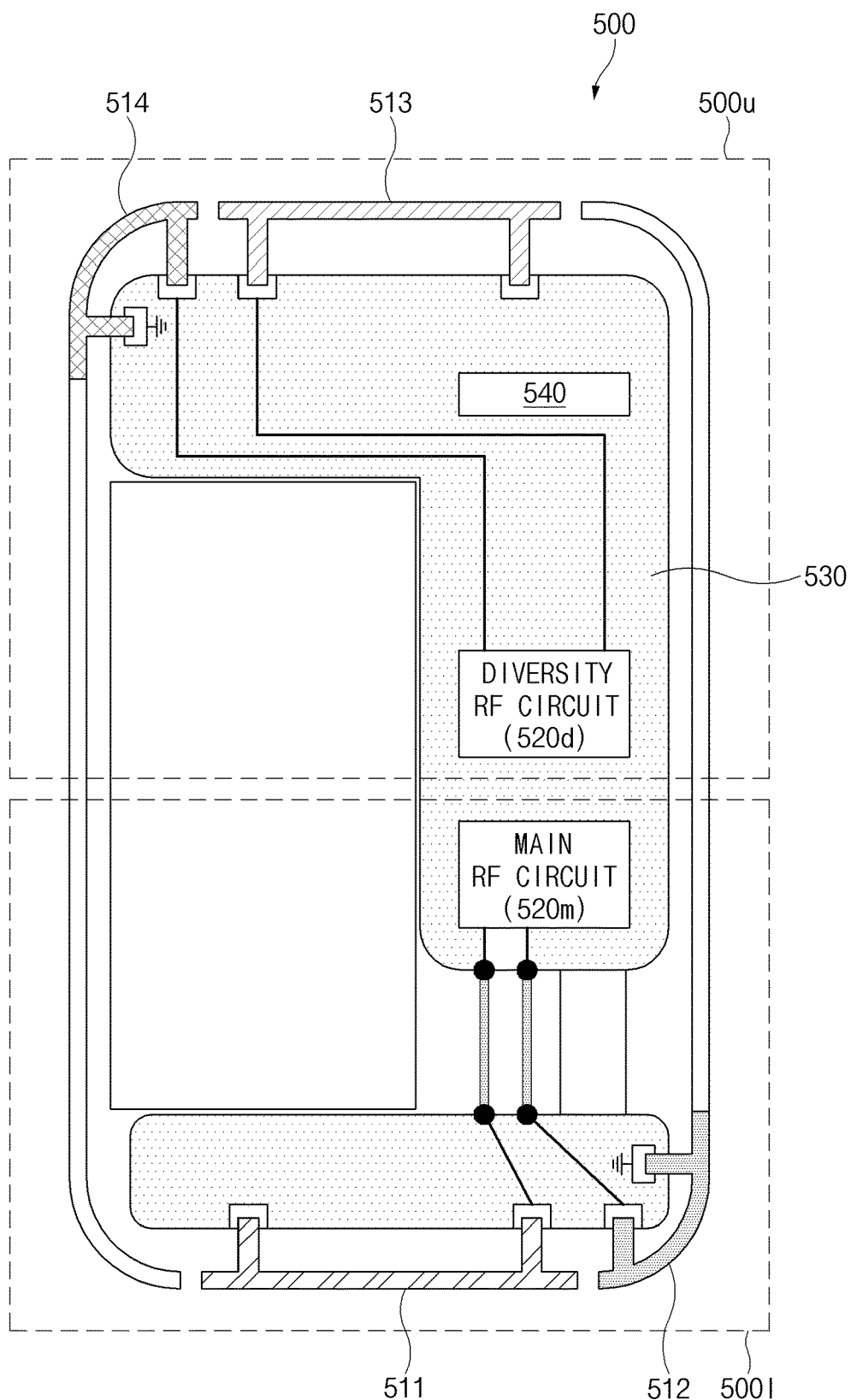
FIG. 5 illustrates an internal configuration of an electronic device according to another embodiment.

FIG. 5 illustrates an internal configuration of an electronic device according to another embodiment.

Referring to FIG. 5, an electronic device 500 may include at least one processor. The at least one processor may include at least one of an application processor and a communication processor.

The at least one processor may be electrically connected with an RF circuit, for example, a radio frequency integrated circuit (RFIC) and may control the operations of the RF circuit. The RF circuit may correspond to a transceiver. Alternatively, in addition to the transceiver, the RF circuit may include various hardware components that are used to process signals received or transmitted through an antenna or an antenna radiator, such as an amplifier (e.g., a power amplifier or a low noise amplifier), a filter, or a switch.

The RF circuit may include a main RF circuit 520m and a diversity RF circuit 520d. In another embodiment, the electronic device 500 may include three or more RF circuits or may include one integrated RF circuit.

According to an embodiment, the main RF circuit 520m may be connected with antenna elements 511 and 512 positioned on a lower portion 5001 of the electronic device 500. For example, the main RF circuit 520m may be electrically connected with the first antenna element 511 and the second antenna element 512. According to an embodiment, the first antenna element 511 and the second antenna element 512 may have different electrical lengths and may transmit/receive signals in at least one frequency band. For example, the first antenna element 511 may transmit/receive signals in a low band LB or may receive signals in a high band/mid band HB/MB. The second antenna element 512 may transmit/receive signals in the HB/MB. In an embodiment, the first antenna element 511 and the second antenna element 512 may receive signals in a common frequency band.

According to an embodiment, the diversity RF circuit 520d may be connected with antenna elements 513 and 514 positioned on an upper portion 500u of the electronic device 500. For example, the diversity RF circuit 520d may be electrically connected with the third antenna element 513 and the fourth antenna element 514. According to an embodiment, the third antenna element 513 and the fourth antenna element 514 may have different electrical lengths and may transmit/receive a signals in at least one frequency band. For example, the third antenna element 513 may receive signals in the LB/HB/MB. The fourth antenna element 514 may receive signals in the HB/MB. In an embodiment, the third antenna element 513 and the fourth antenna element 514 may receive signals in a common frequency band.

According to an embodiment, in the case where the frequency range of the HB received through the second antenna element 512 overlaps the frequency range of the HB receivable through the first antenna element 511, the electronic device 500 may implement a second-order diversity function by using a signal received in common through the first antenna element 511 and the second antenna element 512. Also, the electronic device 500 may utilize a signal received through the third antenna element 513 and the fourth antenna element 514 positioned on the upper portion 500u of the electronic device 500 for diversity. In the case where the first, second, third, and fourth antenna elements 511, 512, 513, and 514 may receive a signal in a common frequency range, the electronic device 500 may implement a fourth-order diversity function.

According to an embodiment, a connector 540 may be positioned on a printed circuit board 530. The connector 540 may be electrically connected with a display, and electrical energy may be supplied to the display through the connector 540. The connector 540 may be the same or similar to the connector 131 illustrated in FIGS. 2 and 3.

According to an embodiment, the electronic device 500 may deactivate an antenna element which is the closest to the connector 540. For example, in FIG. 5, since the third antenna element 513 is closest to the connector 540, the electronic device 500 may deactivate the third antenna element 513. As such, the electronic device 500 may fail to receive signals through the third antenna element 513. In this case, the electronic device 500 may implement a third-order diversity function, which may perform better than fourth-order diversity.

The embodiment illustrated in FIG. 5 is only one embodiment, and the antenna element to be deactivated may change depending on the location of the connector 540. For example, in the case where the connector 540 is positioned on the lower portion 500l, the first antenna element 511 and/or the second antenna element 512 may be deactivated. In this case, the electronic device 500 may implement a second-order diversity function and/or a third-order diversity function.

Figure 6:
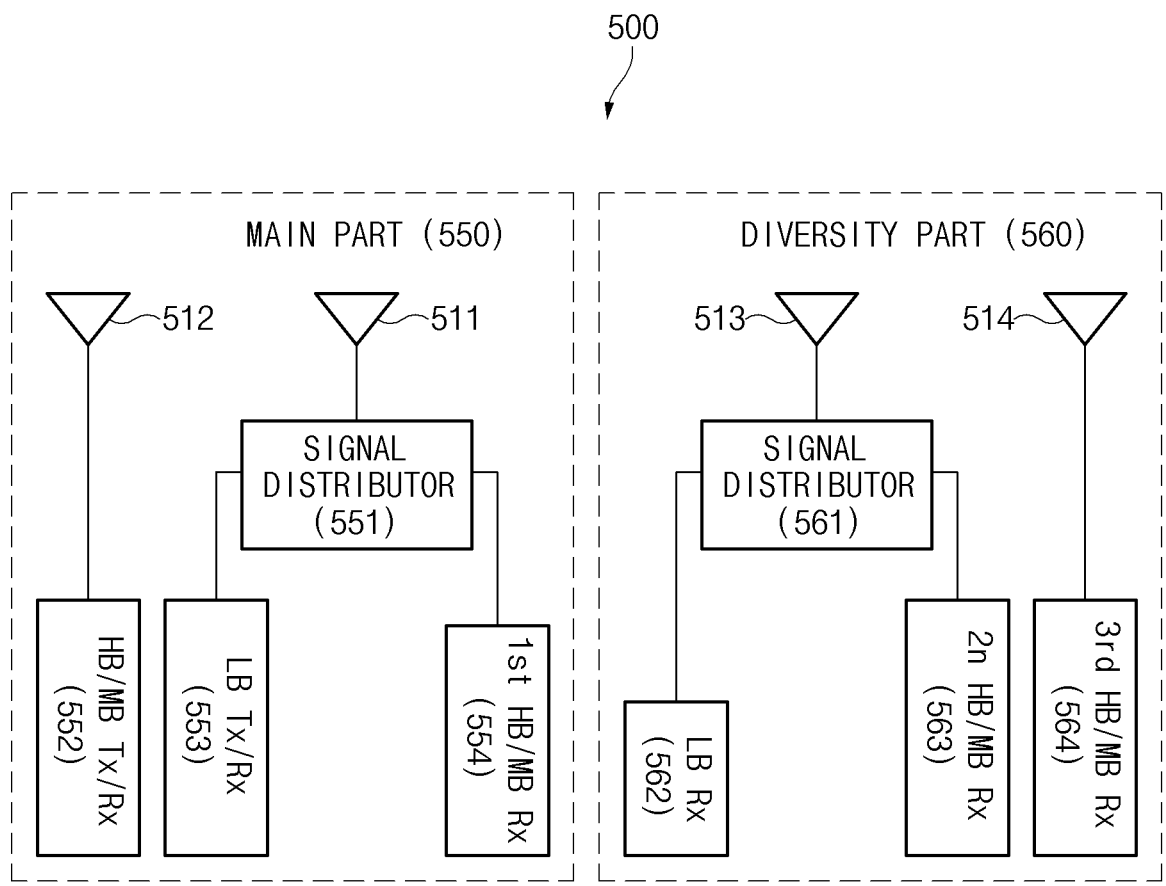
FIG. 6 illustrates a block diagram of components included in an electronic device according to another embodiment.

FIG. 6 illustrates a block diagram of components included in an electronic device according to another embodiment. FIG. 6 is a block diagram of the components illustrated in FIG. 5.

Referring to FIG. 6, the electronic device 500 may include a main part 550 which includes the first antenna element 511, the second antenna element 512, a signal distributer 551, an HB/MB transceiver circuit 552, an LB transceiver circuit 553, and a first HB/MB receiver circuit 554. The electronic device 500 may further include a diversity part 560 which includes the third antenna element 513, the fourth antenna element 514, a signal distributer 561, an LB receiver circuit 562, a second HB/MB receiver circuit 563, and a third HB/MB receiver circuit 564.

The electronic device 500 according to an embodiment may receive signals in the HB or signals in the MB through the four antenna elements 511, 512, 513, and 514. For example, signals received by the first antenna element 511 may be transmitted to the first HB/MB receiver circuit 554 through the signal distributer 551, and signals received by the second antenna element 512 may be transmitted to the HB/MB transceiver circuit 552. Signals received by the third antenna element 513 may be transmitted to the second HB/MB receiver circuit 563 through the signal distributer 561, and signals received by the fourth antenna element 514 may be transmitted to the third HB/MB receiver circuit 564.

According to an embodiment of the present disclosure, the main part 550 may be configured to transmit or receive signals to or from the outside through the first antenna element 511 and the second antenna element 512. For example, the first antenna element 511 may receive or transmit signals in the LB to or from the outside. Also, the first antenna element 511 may receive signals in the MB or signals in the HB from the outside. The second antenna element 512 may receive or transmit signals in the MB or signals in the HB to or from the outside.

In contrast, the diversity part 560 may be configured to receive signals from the outside through the third antenna element 513 and the fourth antenna element 514. For example, the third antenna element 513 may receive signals in the HB, signals in the MB, or signals in the LB. The fourth antenna element 514 may receive signals in the HB and signals in the MB.

According to an embodiment of the present disclosure, the signal distributer 551 may selectively or simultaneously connect the first antenna element 511 with the LB transceiver circuit 553 and the first HB/MB receiver circuit 554. For example, the signal distributer 551 may transmit the LB signal received by the first antenna element 511 to the LB transceiver circuit 553 and may transmit the MB signal and the HB signal thereof to the first HB/MB receiver circuit 554.

The signal distributer 551 may include, for example, a switch, a diplexer, a duplexer, or the like. The switch may selectively connect the first antenna element 511 with the LB transceiver circuit 553 or the first HB/MB receiver circuit 554. The diplexer or the duplexer may simultaneously connect the first antenna element 511 with the LB transceiver circuit 553 and the first HB/MB receiver circuit 554. In the case where the signal distributer 551 includes the diplexer, the signal distributer 551 may separate signals in the LB and signals in the HB/MB. The signal distributer 551 may separate the signals and may transmit each of the separated signals to a corresponding circuit from among the LB transceiver circuit 553 and the first HB/MB receiver circuit 554.

According to an embodiment of the present disclosure, the signal distributer 561 may selectively or simultaneously connect the third antenna element 513 with the LB receiver circuit 562 and the second HB/MB receiver circuit 563. For example, the signal distributer 561 may transmit the LB signal received by the third antenna element 513 to the LB receiver circuit 562 and may transmit the MB signal and the HB signal thereof to the second HB/MB receiver circuit 563. The description given with reference to the first signal distributer 551 may also be applied to the signal distributer 561.

An electronic device according to an embodiment of the present disclosure may include an antenna, a display, a housing that forms at least a portion of an exterior of the electronic device, a printed circuit board that is disposed within the housing, a connector that is disposed on the printed circuit board, a wire that electrically connects the connector and the display, a plurality of filters that are disposed on the printed circuit board, a switch that selectively connects the connector to one or more of the plurality of filters, and at least one processor that is electrically connected with the antenna, the display, and the switch. The at least one processor may feed a power to the antenna, may transmit/receive a signal in a specified frequency band through the antenna supplied with the power, may determine whether the display is in an On state or an Off state, and may control the switch to connect the connector to one or more of the plurality of filters corresponding to the specified frequency band, when the display is in the On state.

The plurality of filters according to an embodiment of the present disclosure may include a first filter and a second filter, and the at least one processor may control the switch to connect the first filter to the connector when a signal in a first frequency band is transmitted/received through the antenna supplied with the power, and may control the switch to connect the second filter to the connector when a signal in a second frequency band is transmitted/received through the antenna supplied with the power.

The housing according to an embodiment of the present disclosure may include a cover glass, a rear cover facing away from the cover glass, and a side member interposed between the cover glass and the rear cover, and the side member may include a first edge, a second edge facing away from the first edge, a third edge connecting one end of the first edge and one end of the second edge, and a fourth edge connecting an opposite end of the first edge and an opposite end of the second edge.

The antenna according to an embodiment of the present disclosure may include a first antenna element including at least a portion of the first edge, a second antenna element including at least a portion of the second edge, a third antenna element including at least a portion of the third edge, and a fourth antenna element including at least a portion of the fourth edge.

The electronic device according to an embodiment of the present disclosure may further include a battery connected with the connector, and the battery may supply electrical energy to the display through the connector and the wire.

The at least one processor according to an embodiment of the present disclosure may include at least one of an application processor and a communication processor.

The wire according to an embodiment of the present disclosure may include a flexible printed circuit board (FPCB).

Each of the plurality of filters according to an embodiment of the present disclosure may include at least one capacitive element and at least one inductive element.

The at least one processor according to an embodiment of the present disclosure may control the switch such that the plurality of filters are disconnected from the connector, when the display is in the Off state.

An electronic device according to an embodiment of the present disclosure may include a housing that forms an exterior of the electronic device and includes a conductive area and a non-conductive area, an antenna that includes at least a portion of the conductive area, a display that is disposed within the housing and includes a display panel and a display driver integrated circuit electrically connected with the display panel, a printed circuit board disposed within the housing, a connector that is disposed on the printed circuit board, a wire that is electrically connecting the connector and the display, a noise reducing circuit that is disposed on the printed circuit board, and at least one processor that is electrically connected with the antenna, the display, and the noise reducing circuit. The at least one processor may be to feed a power to the antenna, to transmit/receive a first signal in a specified frequency band through the antenna supplied with the power, to determine whether the display is in an On state or an Off state, based on a second signal received from the display driver integrated circuit, and to operate the noise reducing circuit based on the specified frequency band when the display is in the On state.

The noise reducing circuit according to an embodiment of the present disclosure may include a plurality of filters, and a switch selectively connecting the connector to one or more of the plurality of filters.

The at least one processor according to an embodiment of the present disclosure may control the switch to connect the connector to one or more of the plurality of filters corresponding to the specified frequency band.

The plurality of filters according to an embodiment of the present disclosure may include at least one of a notch filter and a band stop filter.

The plurality of filters according to an embodiment of the present disclosure may include a first filter and a second filter, and the at least one processor may control the switch to connect the first filter to the connector when a third signal in a first frequency band is transmitted/received through the antenna supplied with the power, and to control the switch to connect the second filter to the connector when a fourth signal in a second frequency band is transmitted/received through the antenna supplied with the power.

An electronic device according to an embodiment of the present disclosure may include a display, a power supply module that supplies a power to the display and the electronic device, a communication module that communicates with an external device by using a first frequency band and/or a second frequency band, an adjustment circuit that is interposed between the display and the power supply module, and configured to operate in a first mode or a second mode, and a processor. The processor may be configured to detect an On state or an Off state of the display while communicating with the external device using the communication module. When the display is in the On state, the processor may be configured to operate the adjustment circuit in the first mode when the communication module uses the first frequency band, and to operate the adjustment circuit in the second mode when the communication module uses the second frequency band.

The adjustment circuit according to an embodiment of the present disclosure may include a plurality of filters, and a switch that selectively connects the power supply module to one or more of the plurality of filters.

The processor according to an embodiment of the present disclosure may control the switch to connect the power supply module to one or more of the plurality of filters corresponding to the first frequency band, when the communication module uses the first frequency band.

The processor according to an embodiment of the present disclosure may control the switch to disconnect the power supply module from the one or more of the plurality of filters, when the communication module uses the second frequency band.

The processor according to an embodiment of the present disclosure may control the switch to disconnect the plurality of filters from the power supply module, when the display is in the Off state.

The electronic device according to an embodiment of the present disclosure may further include a printed circuit board, and a connector that is disposed on the printed circuit board and configured to connect the display and the power supply module.

Figure 7:
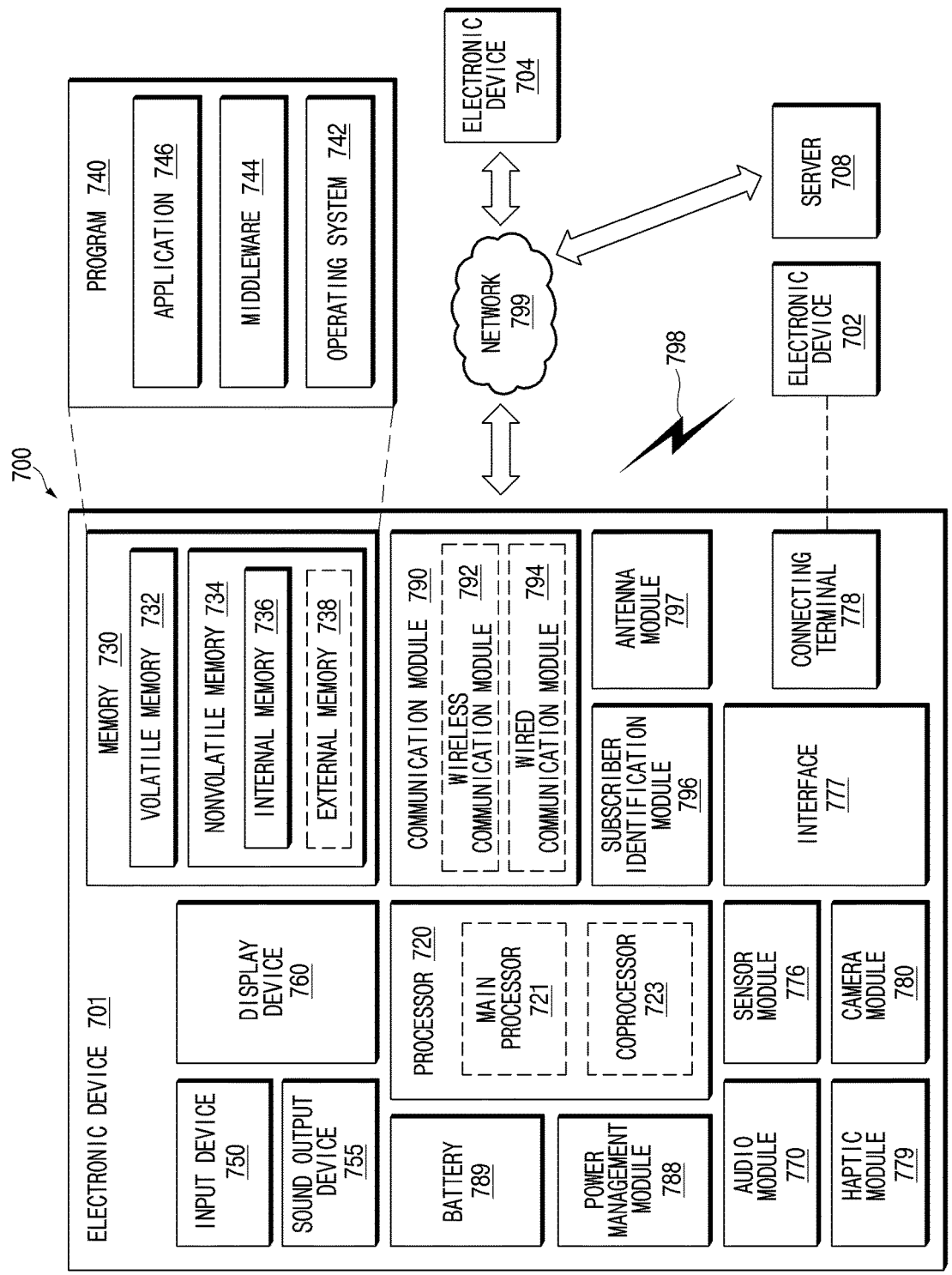
FIG. 7 is a block diagram of an electronic device in a network environment according to various embodiments.

FIG. 7 is a block diagram of an electronic device in a network environment according to various embodiments.

Referring to FIG. 7, an electronic device 701 may communicate with an electronic device 702 through a first network 798 (e.g., a short-range wireless communication) or may communicate with an electronic device 704 or a server 708 through a second network 799 (e.g., a long-distance wireless communication) in a network environment 700. According to an embodiment, the electronic device 701 may communicate with the electronic device 704 through the server 708. According to an embodiment, the electronic device 701 may include a processor 720, a memory 730, an input device 750, a sound output device 755, a display device 760, an audio module 770, a sensor module 776, an interface 777, a haptic module 779, a camera module 780, a power management module 788, a battery 789, a communication module 790, a subscriber identification module 796, and an antenna module 797. According to some embodiments, at least one (e.g., the display device 760 or the camera module 780) among components of the electronic device 701 may be omitted or other components may be added to the electronic device 701. According to some embodiments, some components may be integrated and implemented as in the case of the sensor module 776 (e.g., a fingerprint sensor, an iris sensor, or an illuminance sensor) embedded in the display device 760 (e.g., a display).

The processor 720 may operate, for example, software (e.g., a program 740) to control at least one of other components (e.g., a hardware or software component) of the electronic device 701 connected to the processor 720 and may process and compute a variety of data. The processor 720 may load a command set or data, which is received from other components (e.g., the sensor module 776 or the communication module 790), into a volatile memory 732, may process the loaded command or data, and may store result data into a nonvolatile memory 734. According to an embodiment, the processor 720 may include a main processor 721 (e.g., a central processing unit or an application processor) and an auxiliary processor 723 (e.g., a graphic processing device, an image signal processor, a sensor hub processor, or a communication processor), which operates independently from the main processor 721, additionally or alternatively uses less power than the main processor 721, or is specified to a designated function. In this case, the auxiliary processor 723 may operate separately from the main processor 721 or embedded.

In this case, the auxiliary processor 723 may control, for example, at least some of functions or states associated with at least one component (e.g., the display device 760, the sensor module 776, or the communication module 790) among the components of the electronic device 701 instead of the main processor 721 while the main processor 721 is in an inactive (e.g., sleep) state or together with the main processor 721 while the main processor 721 is in an active (e.g., an application execution) state. According to an embodiment, the auxiliary processor 723 (e.g., the image signal processor or the communication processor) may be implemented as a part of another component (e.g., the camera module 780 or the communication module 790) that is functionally related to the auxiliary processor 723. The memory 730 may store a variety of data used by at least one component (e.g., the processor 720 or the sensor module 776) of the electronic device 701, for example, software (e.g., the program 740) and input data or output data with respect to commands associated with the software. The memory 730 may include the volatile memory 732 or the nonvolatile memory 734.

The program 740 may be stored in the memory 730 as software and may include, for example, an operating system 742, a middleware 744, or an application 746.

The input device 750 may be a device for receiving a command or data, which is used for a component (e.g., the processor 720) of the electronic device 701, from an outside (e.g., a user) of the electronic device 701 and may include, for example, a microphone, a mouse, or a keyboard.

The sound output device 755 may be a device for outputting a sound signal to the outside of the electronic device 701 and may include, for example, a speaker used for general purposes, such as multimedia play or recordings play, and a receiver used only for receiving calls. According to an embodiment, the receiver and the speaker may be either integrally or separately implemented.

The display device 760 may be a device for visually presenting information to the user of the electronic device 701 and may include, for example, a display, a hologram device, or a projector and a control circuit for controlling a corresponding device. According to an embodiment, the display device 760 may include a touch circuitry or a pressure sensor for measuring an intensity of pressure on the touch.

The audio module 770 may convert a sound and an electrical signal in dual directions. According to an embodiment, the audio module 770 may obtain the sound through the input device 750 or may output the sound through an external electronic device (e.g., the electronic device 702 (e.g., a speaker or a headphone)) wired or wirelessly connected to the sound output device 755 or the electronic device 701.

The sensor module 776 may generate an electrical signal or a data value corresponding to an operating state (e.g., power or temperature) inside or an environmental state outside the electronic device 701. The sensor module 776 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 777 may support a designated protocol wired or wirelessly connected to the external electronic device (e.g., the electronic device 702). According to an embodiment, the interface 777 may include, for example, an HDMI (high-definition multimedia interface), a USB (universal serial bus) interface, an SD card interface, or an audio interface.

A connecting terminal 778 may include a connector that physically connects the electronic device 701 to the external electronic device (e.g., the electronic device 702), for example, an HDMI connector, a USB connector, an SD card connector, or an audio connector (e.g., a headphone connector).

The haptic module 779 may convert an electrical signal to a mechanical stimulation (e.g., vibration or movement) or an electrical stimulation perceived by the user through tactile or kinesthetic sensations. The haptic module 779 may include, for example, a motor, a piezoelectric element, or an electric stimulator.

The camera module 780 may shoot a still image or a video image. According to an embodiment, the camera module 780 may include, for example, at least one lens, an image sensor, an image signal processor, or a flash.

The power management module 788 may be a module for managing power supplied to the electronic device 701 and may serve as at least a part of a power management integrated circuit (PMIC).

The battery 789 may be a device for supplying power to at least one component of the electronic device 701 and may include, for example, a non-rechargeable (primary) battery, a rechargeable (secondary) battery, or a fuel cell.

The communication module 790 may establish a wired or wireless communication channel between the electronic device 701 and the external electronic device (e.g., the electronic device 702, the electronic device 704, or the server 708) and support communication execution through the established communication channel. The communication module 790 may include at least one communication processor operating independently from the processor 720 (e.g., the application processor) and supporting the wired communication or the wireless communication. According to an embodiment, the communication module 790 may include a wireless communication module 792 (e.g., a cellular communication module, a short-range wireless communication module, or a GNSS (global navigation satellite system) communication module) or a wired communication module 794 (e.g., an LAN (local area network) communication module or a power line communication module) and may communicate with the external electronic device using a corresponding communication module among them through the first network 798 (e.g., the short-range communication network such as a Bluetooth, a WiFi direct, or an IrDA (infrared data association)) or the second network 799 (e.g., the long-distance wireless communication network such as a cellular network, an internet, or a computer network (e.g., LAN or WAN)). The above-mentioned various communication modules 790 may be implemented into one chip or into separate chips, respectively.

According to an embodiment, the wireless communication module 792 may identify and authenticate the electronic device 701 using user information stored in the subscriber identification module 796 in the communication network.

The antenna module 797 may include one or more antennas to transmit or receive the signal or power to or from an external source. According to an embodiment, the communication module 790 (e.g., the wireless communication module 792) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 701 and the external electronic device 704 through the server 708 connected to the second network 799. Each of the electronic devices 702 and 704 may be the same or different types as or from the electronic device 701. According to an embodiment, all or some of the operations performed by the electronic device 701 may be performed by another electronic device or a plurality of external electronic devices. When the electronic device 701 performs some functions or services automatically or by request, the electronic device 701 may request the external electronic device to perform at least some of the functions related to the functions or services, in addition to or instead of performing the functions or services by itself. The external electronic device receiving the request may carry out the requested function or the additional function and transmit the result to the electronic device 701. The electronic device 701 may provide the requested functions or services based on the received result as is or after additionally processing the received result. To this end, for example, a cloud computing, distributed computing, or client-server computing technology may be used.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 740) including an instruction stored in a machine-readable storage media (e.g., an internal memory 736 or an external memory 738) readable by a machine (e.g., a computer). The machine may be a device that calls the instruction from the machine-readable storage media and operates depending on the called instruction and may include the electronic device (e.g., the electronic device 701). When the instruction is executed by the processor (e.g., the processor 720), the processor may perform a function corresponding to the instruction directly or using other components under the control of the processor. The instruction may include a code that is made by a compiler or a code executable by an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

What is claimed is:

1. An electronic device comprising:
an antenna;
a display;
a housing forming at least a portion of an exterior of the electronic device;
a printed circuit board disposed within the housing;
a connector disposed on the printed circuit board;
a flexible printed circuit board (FPCB) electrically connecting the connector and the display;
a plurality of filters disposed on the printed circuit board;
a switch selectively connecting the connector to one or more of the plurality of filters; and
at least one processor electrically connected with the antenna, the display, and the switch,
wherein the at least one processor is configured to:
feed a power to the antenna;
transmit/receive a signal in a specified frequency band through the antenna supplied with the power;
determine whether the display is in an On state or an Off state; and
when the display is in the On state, control the switch to connect the connector to one or more of the plurality of filters corresponding to the specified frequency band.

2. The electronic device of claim 1, wherein the plurality of filters include a first filter and a second filter, and
wherein the at least one processor is further configured to:
control the switch to connect the first filter to the connector when a signal in a first frequency band is transmitted/received through the antenna supplied with the power; and
control the switch to connect the second filter to the connector when a signal in a second frequency band is transmitted/received through the antenna supplied with the power.

3. The electronic device of claim 1, wherein the housing includes a cover glass, a rear cover facing away from the cover glass, and a side member interposed between the cover glass and the rear cover, and
wherein the side member includes a first edge, a second edge facing away from the first edge, a third edge connecting one end of the first edge and one end of the second edge, and a fourth edge connecting an opposite end of the first edge and an opposite end of the second edge.

4. The electronic device of claim 3, wherein the antenna includes:
a first antenna element including at least a portion of the first edge;
a second antenna element including at least a portion of the second edge;
a third antenna element including at least a portion of the third edge; and
a fourth antenna element including at least a portion of the fourth edge.

5. The electronic device of claim 1, further comprising:
a battery connected with the connector,
wherein the battery supplies electrical energy to the display through the connector and the FPCB.

6. The electronic device of claim 1, wherein the at least one processor includes at least one of an application processor and a communication processor.

7. The electronic device of claim 1, wherein each of the plurality of filters includes at least one capacitive element and at least one inductive element.

8. The electronic device of claim 1, wherein the at least one processor is further configured to:
when the display is in the Off state, control the switch such that the plurality of filters are disconnected from the connector.

9. The electronic device of claim 1,
wherein the at least one processor is further configured to:
determine whether the display is in the On state or the Off state, based on a second signal received from a display driver integrated circuit.

10. The electronic device of claim 9, further comprising a noise reducing circuit;
a plurality of filters; and
a switch selectively connecting the connector to one or more of the plurality of filters.

11. The electronic device of claim 10, wherein the at least one processor is further configured to:

control the switch to connect the connector to one or more of the plurality of filters corresponding to the specified frequency band.

12. The electronic device of claim 1, wherein the plurality of filters include at least one of a notch filter and a band stop filter.

13. The electronic device of claim 10, wherein the plurality of filters include a first filter and a second filter, and wherein the at least one processor is further configured to:
control the switch to connect the first filter to the connector when a third signal in a first frequency band is transmitted/received through the antenna supplied with the power; and
control the switch to connect the second filter to the connector when a fourth signal in a second frequency band is transmitted/received through the antenna supplied with the power.

14. The electronic device of claim 1,
wherein the processor is further configured to:
determine the On state or the Off state of the display while communicating with an external device using a communication module.

15. The electronic device of claim 14, further comprising an adjustment circuit;
a plurality of filters; and
a switch selectively connecting a power supply module to one or more of the plurality of filters.

16. The electronic device of claim 15, wherein the processor is further configured to:
control the switch to connect the power supply module to one or more of the plurality of filters corresponding to the first frequency band, when the communication module uses the first frequency band.

17. The electronic device of claim 15, wherein the processor is further configured to:
control the switch to disconnect the power supply module from the one or more of the plurality of filters, when the communication module uses the second frequency band.

18. The electronic device of claim 15, wherein the processor is further configured to:
control the switch to disconnect the plurality of filters from the power supply module, when the display is in the Off state.

19. The electronic device of claim 15, further comprising:
a printed circuit board; and
a connector disposed on the printed circuit board and configured to connect the display and the power supply module.

* * * * *